(12) United States Patent
Imai

(10) Patent No.: US 9,263,543 B2
(45) Date of Patent: Feb. 16, 2016

(54) METHOD FOR MANUFACTURING A SEMICONDUCTOR DEVICE

(71) Applicant: FUJI ELECTRIC CO., LTD., Kawasaki-shi (JP)

(72) Inventor: Fumikazu Imai, Tsukuba (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/511,151

(22) Filed: Oct. 9, 2014

(65) Prior Publication Data

US 2015/0024581 A1  Jan. 22, 2015

Related U.S. Application Data

(63) Continuation of application No. PCT/JP2013/057312, filed on Mar. 14, 2013.

(30) Foreign Application Priority Data

Apr. 18, 2012  (JP) ................. 2012-095159

(51) Int. Cl.
*H01L 29/66* (2006.01)
*H01L 29/872* (2006.01)
*H01L 29/06* (2006.01)
*H01L 29/16* (2006.01)
*H01L 21/285* (2006.01)
*H01L 29/45* (2006.01)
*H01L 29/47* (2006.01)

(52) U.S. Cl.
CPC ...... *H01L 29/66143* (2013.01); *H01L 21/2855* (2013.01); *H01L 21/28518* (2013.01); *H01L 21/28537* (2013.01); *H01L 29/0619* (2013.01); *H01L 29/1608* (2013.01); *H01L 29/45* (2013.01); *H01L 29/47* (2013.01); *H01L 29/6606* (2013.01); *H01L 29/872* (2013.01)

(58) Field of Classification Search
None
See application file for complete search history.

(56) References Cited

U.S. PATENT DOCUMENTS

| 2006/0273323 A1 | 12/2006 | Yamamoto et al. |
| 2007/0138482 A1 | 6/2007 | Tanimoto |
| 2009/0098719 A1 | 4/2009 | Matsuno et al. |
| 2009/0236611 A1* | 9/2009 | Yamamoto et al. ............. 257/77 |

FOREIGN PATENT DOCUMENTS

| JP | H02-84719 A | 3/1990 |
| JP | 07-078786 | 3/1995 |

(Continued)

*Primary Examiner* — Stanetta Isaac
(74) *Attorney, Agent, or Firm* — Rabin & Berdo, P.C.

(57) ABSTRACT

A method for manufacturing a semiconductor device includes (a) providing a silicon carbide semiconductor substrate; and (b) forming an electrode structure on the silicon carbide semiconductor substrate by (i) forming a Schottky layer including a metal selected from the group consisting of titanium, tungsten, molybdenum, and chrome on a front surface of the silicon carbide semiconductor substrate; (ii) heating the Schottky layer to form a Schottky electrode which has a Schottky contact with the silicon carbide semiconductor substrate; and (iii) forming a surface electrode comprised of aluminum or aluminum including silicon on a surface of the Schottky electrode, while heating at a temperature range effective for the surface electrode to closely cover any uneven portion of the Schottky electrode and provide a surface electrode having a predetermined reflectance that is equal to or less than 80% so that an improved recognition rate by an automatic wire bonding apparatus is obtained.

14 Claims, 12 Drawing Sheets

(56) References Cited

FOREIGN PATENT DOCUMENTS

| JP | 2005-277240 A | 10/2005 |
| JP | 2006-120761 A | 5/2006 |
| JP | 2006-344688 A | 12/2006 |
| JP | 2007-184571 A | 7/2007 |
| JP | 2008-135611 A | 6/2008 |
| JP | 2009-094392 A | 4/2009 |
| JP | 2010-086999 A | 4/2010 |

* cited by examiner

FIG. 13

| REFLECTANCE (%) | N | NUMBER OF SAMPLES RECOGNIZED | | RECOGNITION RATE (%) | |
|---|---|---|---|---|---|
| | | APPARATUS A | APPARATUS B | APPARATUS A | APPARATUS B |
| 45~50 | 46 | 46 | 46 | 100 | 100 |
| 50~55 | 48 | 48 | 48 | 100 | 100 |
| 55~60 | 48 | 48 | 38 | 100 | 79.2 |
| 60~65 | 48 | 48 | 36 | 100 | 75.0 |
| 65~70 | 48 | 38 | 26 | 79.2 | 54.2 |
| 70~80 | 36 | 25 | 9 | 69.4 | 25.0 |

METHOD FOR MANUFACTURING A SEMICONDUCTOR DEVICE

This non-provisional Application is a continuation of and claims the benefit of the priority of Applicant's earlier filed International Application No. PCT/JP2013/057312 filed Mar. 14, 2013, the entire contents of which are incorporated herein by reference.

BACKGROUND OF THE INVENTION

1. Field of the Invention

The present invention relates to a method for manufacturing a semiconductor device. In particular, the invention relates to a method for manufacturing a semiconductor device having an electrode structure that has an appropriate reflectance and does not generate a void.

2. Description of the Related Art

Hitherto, semiconductor devices using silicon (Si) as a semiconductor material have been mainly used as power devices. Silicon carbide (SiC) which is a wide gap semiconductor has the following physical property values: thermal conductivity that is three times more than that of silicon; maximum electric field intensity that is ten times more than that of silicon; and an electron drift speed that is two times more than that of silicon. Therefore, each institute has conducted research on an application technique using SiC since a power device using SiC has a high breakdown voltage and low loss and can operate at a high temperature.

As the structure of the power device, a vertical semiconductor device has been mainly used in which a rear surface electrode including a low-resistance ohmic electrode is provided on the rear surface side of a substrate. The rear surface electrode is made of various materials and has various structures. As an example of the structures, for example, a laminate of a titanium layer, a nickel layer, and a silver layer (for example, see JP 2007-184571 A, Patent Document 1) or a laminate of a titanium layer, a nickel layer, and a gold layer (for example, see JP 2010-86999 A, Patent Document 2) has been proposed.

In a vertical semiconductor device using SiC which is typified by a Schottky barrier diode, a method has been used which forms a nickel layer on a SiC substrate, heats the nickel layer to form a nickel silicide layer, and forms an ohmic contact between the SiC substrate and the nickel silicide layer (for example, see Patent Documents 1 and 2).

As a method for forming an ohmic electrode, a method has been proposed which forms a plurality of metal films on a SiC substrate and performs a heating process at a temperature of 700° C. to 1100° C., and most preferably, about 800° C. to obtain good ohmic characteristics (for example, see JP 2005-277240 A, Patent Document 3). Further, a technique has been proposed which radiates a laser beam to form an ohmic electrode (for example, see JP 2008-135611 A, Patent Document 4).

For a surface electrode which is formed on the front surface of the SiC substrate, a metal layer that is made of aluminum or aluminum alloy is formed on the Schottky contact to form the electrode structure. When the Schottky contact is not completely covered with the metal layer, a void is generated and causes an element defect.

In particular, the surface electrode of the SiC semiconductor needs to closely cover the uneven pattern of the Schottky contact (Schottky electrode). In addition, the surface electrode needs to be formed so as to have reflectance which is the most suitable for image recognition, such as positioning, when automatic wire bonding is performed.

The invention has been made in view of the above-mentioned problems and an object of the invention is to provide a method for manufacturing a semiconductor device which closely covers an uneven portion of a Schottky contact. In addition, an object of the invention is to provide a method for manufacturing a semiconductor device which can form a surface electrode having reflectance that is the most suitable for image recognition such as positioning.

SUMMARY OF THE INVENTION

In order to achieve the objects, according to an aspect of the invention, there is provided a method for manufacturing a semiconductor device in which an electrode structure is formed on a silicon carbide semiconductor substrate. The method has the following characteristics. A Schottky layer including a metal selected from the group consisting of titanium, tungsten, molybdenum, and chrome is formed on a front surface of the silicon carbide semiconductor substrate. Then, the Schottky layer is heated to form a Schottky electrode which has a Schottky contact with the silicon carbide semiconductor substrate. In addition, a surface electrode which is made of aluminum or aluminum including silicon is formed on a surface of the Schottky electrode. When the surface electrode is formed, the surface electrode is heated in a temperature range suitable for conditions that the surface electrode closely covers an uneven portion of the Schottky electrode and has a predetermined reflectance or less.

In the method for manufacturing a semiconductor device according to the above-mentioned aspect of the invention, the surface electrode may be formed by a sputtering method. Sputter pressure may be equal to or greater than 0.1 Pa and equal to or less than 1 Pa. A temperature of the silicon carbide semiconductor substrate may be equal to or higher than 100° C. and equal to or lower than 500° C.

The heating may be performed in a temperature range in which the reflectance of the surface electrode is equal to or less than 80%.

A rear surface electrode structure including an ohmic electrode, which is a nickel silicide layer including titanium carbide, and a rear surface electrode, which is a metal layer, may be formed on a rear surface of the silicon carbide semiconductor substrate.

According to the above-mentioned structure, a layer including titanium is formed on the silicon carbide semiconductor substrate and is heated to form the Schottky contact. Then, aluminum or aluminum including silicon is formed as the surface electrode. In the formation of the surface electrode by the sputtering method, when the relationship between sputtering pressure and sputtering temperature satisfies predetermined conditions, the surface electrode closely covers an uneven portion of the surface of the Schottky electrode. At the same time, the surface electrode can have reflectance that is the most suitable for image recognition when automatic wire bonding is performed.

According to the invention, it is possible to closely cover an uneven portion of a Schottky contact. In addition, it is possible to form a surface electrode having reflectance that is the most suitable for image recognition such as positioning.

BRIEF DESCRIPTION OF DRAWINGS

FIG. 13 is a diagram illustrating the relationship between the reflectance of a surface electrode in a SiC semiconductor device according to the invention and the recognition rate of an automatic wire bonding apparatus (part 1)

DETAILED DESCRIPTION OF THE INVENTION

Embodiment

Hereinafter, a preferred embodiment of a method for manufacturing a semiconductor device according to the invention will be described in detail with reference to the accompanying drawings. In the description of the following embodiments and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols.

In the invention, a nickel silicide layer including titanium carbide is referred to as an ohmic electrode, a metal layer formed on the ohmic electrode is referred to as a rear surface electrode, and a structure including the ohmic electrode and the rear surface electrode is referred to as a rear surface electrode structure. A Schottky electrode is formed on a surface of a silicon carbide (SiC) substrate which is opposite to the rear surface electrode structure so as to come into contact with the SiC substrate and a surface electrode (front surface electrode), which is a metal layer, is formed on the surface of the Schottky electrode. A structure including the Schottky electrode and the surface electrode is referred to as a surface electrode structure. A layer including a titanium carbide layer which is formed by heating a layer including nickel and titanium has high adhesion to a nickel silicide layer and high adhesion to a titanium layer used in the rear surface electrode.

Figure 1:
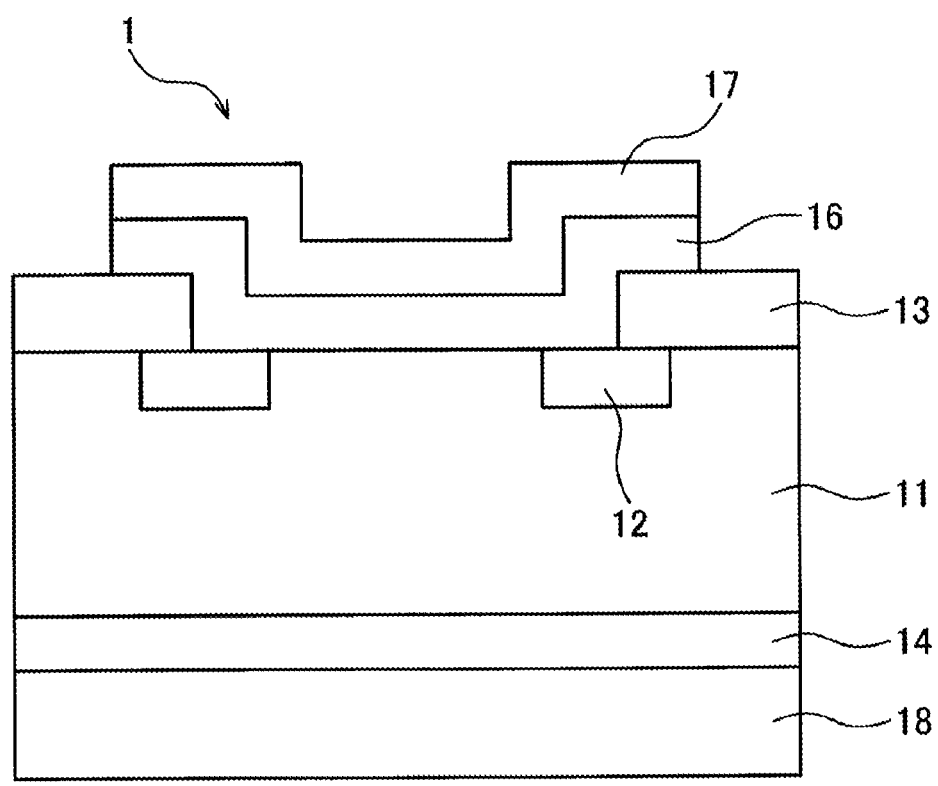
FIG. 1 is a cross-sectional view illustrating a Schottky barrier diode according to an embodiment of a semiconductor device of the invention.

As the semiconductor device according to the invention, a Schottky barrier diode as a SiC semiconductor device will be described. FIG. 1 is a cross-sectional view illustrating the Schottky barrier diode according to an embodiment of the semiconductor device of the invention. A Schottky barrier diode 1 as the SiC semiconductor device includes a SiC substrate 11. In addition, a guard ring 12, an insulating layer 13, a Schottky electrode 16, and a surface electrode 17 are formed on the front surface side of the SiC substrate 11. A nickel silicide layer 14 including titanium carbide and a rear surface electrode 18 are formed on the rear surface side of the SiC substrate 11.

Figure 2:
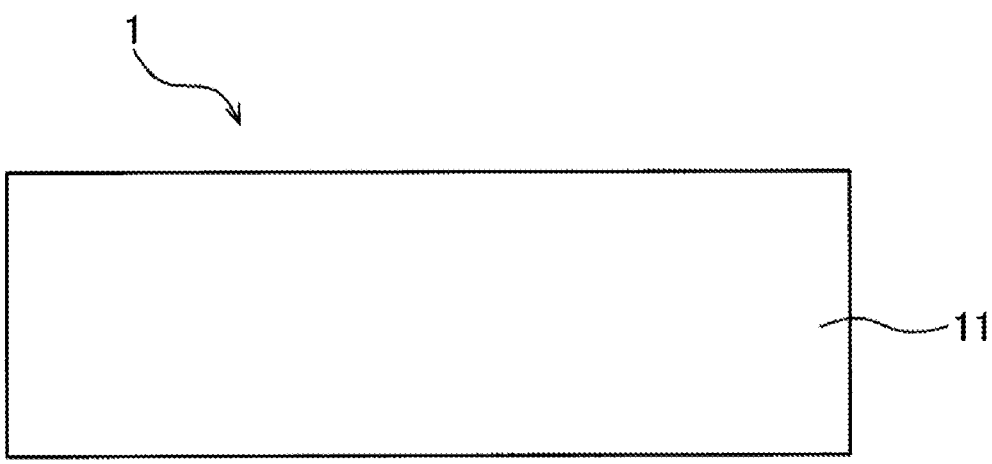
FIG. 2 is a cross-sectional view illustrating a method for manufacturing the Schottky barrier diode (part 1)
Figure 3:
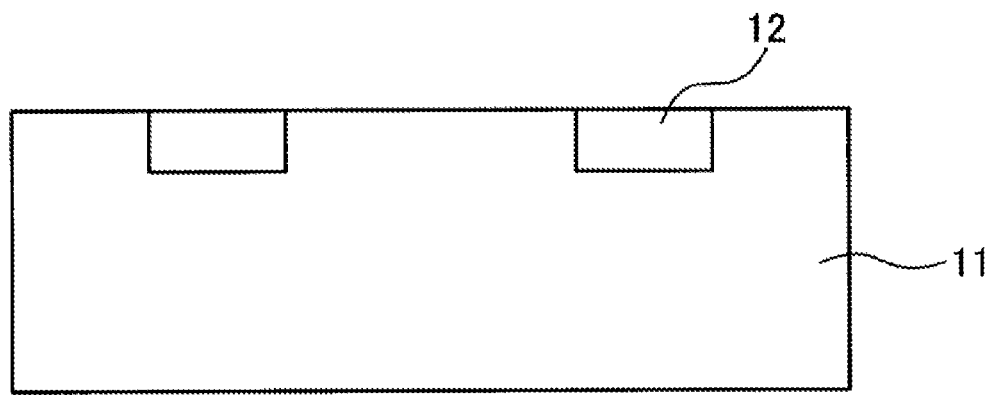
FIG. 3 is a cross-sectional view illustrating the method for manufacturing the Schottky barrier diode (part 2)

FIGS. 2 to 9 are cross-sectional views illustrating a method for manufacturing the Schottky barrier diode. Hereinafter, processes for manufacturing the Schottky barrier diode will be sequentially described. FIG. 2 is a cross-sectional view illustrating the SiC substrate. The SiC substrate 11 includes a wafer layer (not illustrated) which is made of SiC and a SiC epitaxial layer which is formed on the wafer layer. FIG. 3 is a cross-sectional view illustrating a process of forming the guard ring. Ions are implanted into a portion of the epitaxial layer on the front surface of the SiC substrate 11 to form the guard ring 12.

Figure 4:
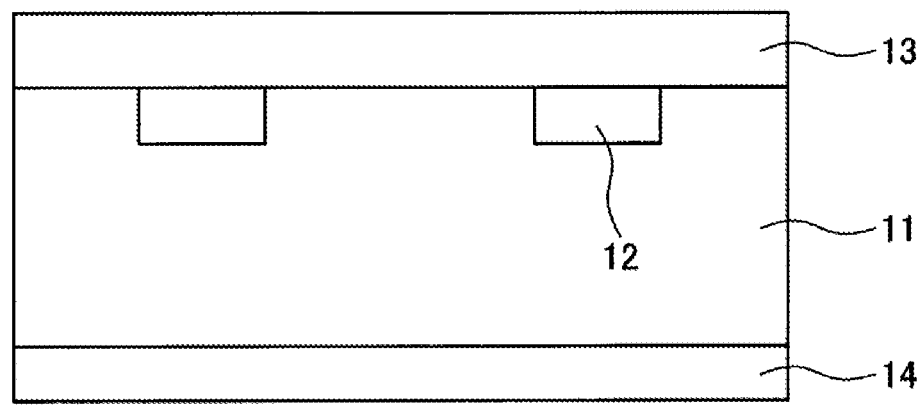
FIG. 4 is a cross-sectional view illustrating the method for manufacturing the Schottky barrier diode (part 3)

FIG. 4 is a cross-sectional view illustrating a process of forming the insulating layer and the nickel silicide layer. The insulating layer 13 which is made of $SiO_2$ is formed on the guard ring 12. Then, a layer including nickel and titanium is formed on the rear surface of the SiC substrate 11 and is then heated to form the nickel silicide layer 14 including titanium carbide.

It is preferable that, as the layer including nickel and titanium, a nickel layer and a titanium layer be sequentially formed on the SiC substrate 11. When nickel and titanium are laminated, the ratio of the thickness of nickel and the thickness of titanium is in the range of 1:1 to 10:1, and preferably, in the range of 3:1 to 6:1. At that time, it is preferable that the thickness of nickel be in the range of 20 nm to 100 nm and the thickness of titanium be in the range of 10 nm to 50 nm. In addition, the layer may be formed of an alloy in which titanium is included in nickel. In this case, the ratio of nickel to titanium may be in the range of 1:1 to 10:1, and preferably, 3:1 to 6:1.

The nickel layer and the titanium layer can be formed by various thin film forming methods, such as a vapor deposition method and a sputtering method. After the thin films are formed, heating is performed in an argon atmosphere at a temperature of 1000° C. to 1200° C. to obtain the nickel silicide layer 14. The formed nickel silicide layer 14 including titanium carbide has a thickness of 10 nm to 100 nm, and preferably, 20 nm to 30 nm.

Since titanium carbide has high adhesion to titanium in a laminate forming the rear surface electrode 18, which will be subsequently formed, it has a function of suppressing the peeling-off of the rear surface electrode 18. In addition, in the nickel silicide layer including titanium carbide, when the number of carbon atoms included in titanium carbide in the outermost surface is equal to or greater than 12% of the total number of carbon atoms precipitated on the outermost surface, the rear surface electrode 18 does not peel off, which is preferable. Even when the number of carbon atoms is less than 12% of the total number of carbon atoms, it is possible to suppress the peeling-off of the rear surface electrode 18 and to improve yield.

Figure 5:
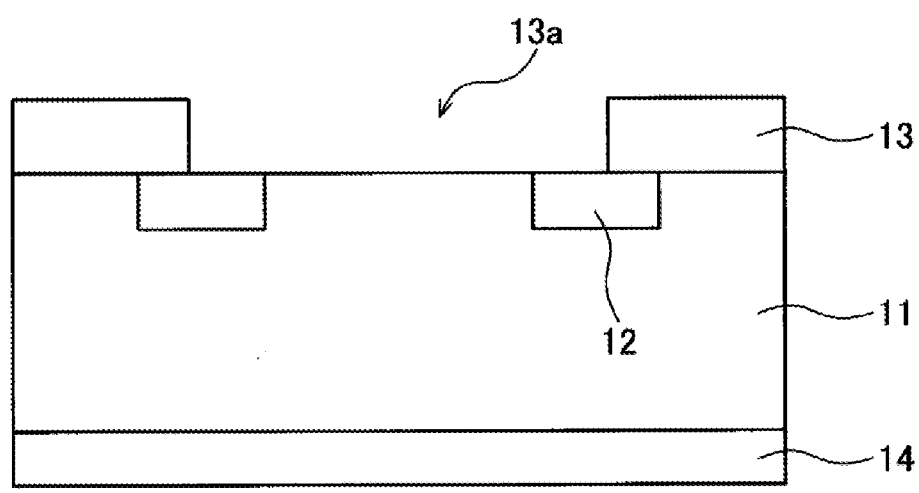
FIG. 5 is a cross-sectional view illustrating the method for manufacturing the Schottky barrier diode (part 4)
Figure 6:
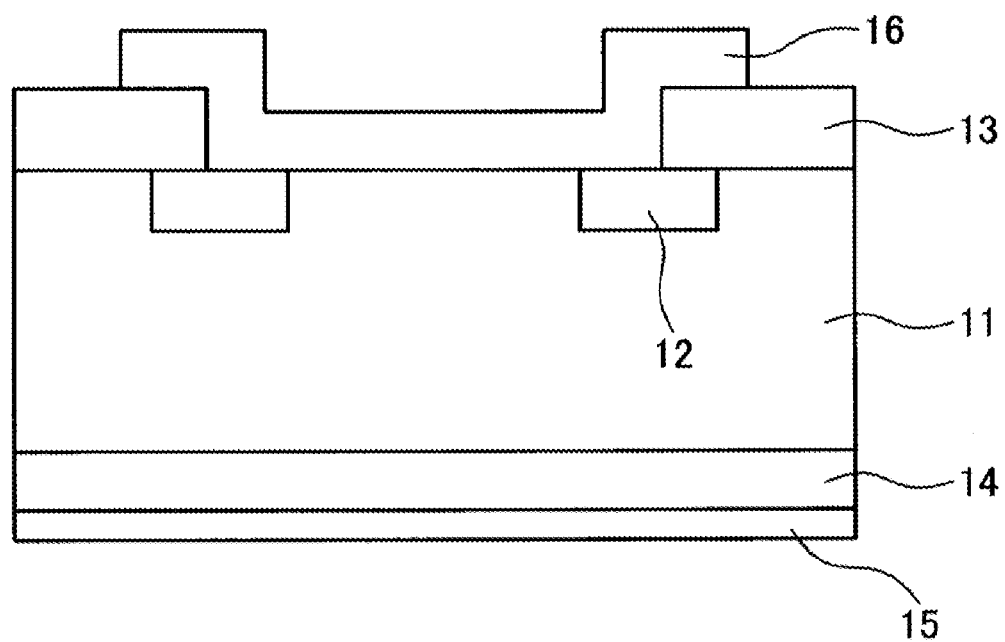
FIG. 6 is a cross-sectional view illustrating the method for manufacturing the Schottky barrier diode (part 5)

FIG. 5 is a cross-sectional view illustrating a process of forming a contact hole. As illustrated in FIG. 5, a portion of the insulating layer 13 is removed by etching to form a contact hole 13a. FIG. 6 is a cross-sectional view illustrating a process of forming the Schottky electrode. The Schottky electrode 16 is formed in the contact hole 13a of the SiC substrate 11 which is exposed by etching so as to come into contact with the SiC substrate 11. As the Schottky electrode 16, for example, a Schottky contact is formed by forming a titanium film and heating the titanium film.

The metal material forming the Schottky electrode 16 may be tungsten, molybdenum, or chrome, in addition to titanium. The heating temperature is in the range of about 400° C. to 600° C. The heating process is performed in an argon or helium atmosphere. According to the heating conditions, some of the carbon atoms included in the nickel silicide layer 14 are precipitated on the surface (rear surface side) of the nickel silicide layer 14 including titanium carbide and a carbon layer 15 is formed as illustrated in FIG. 6. The carbon layer 15 includes several atomic layers and is locally precipitated.

Figure 7:
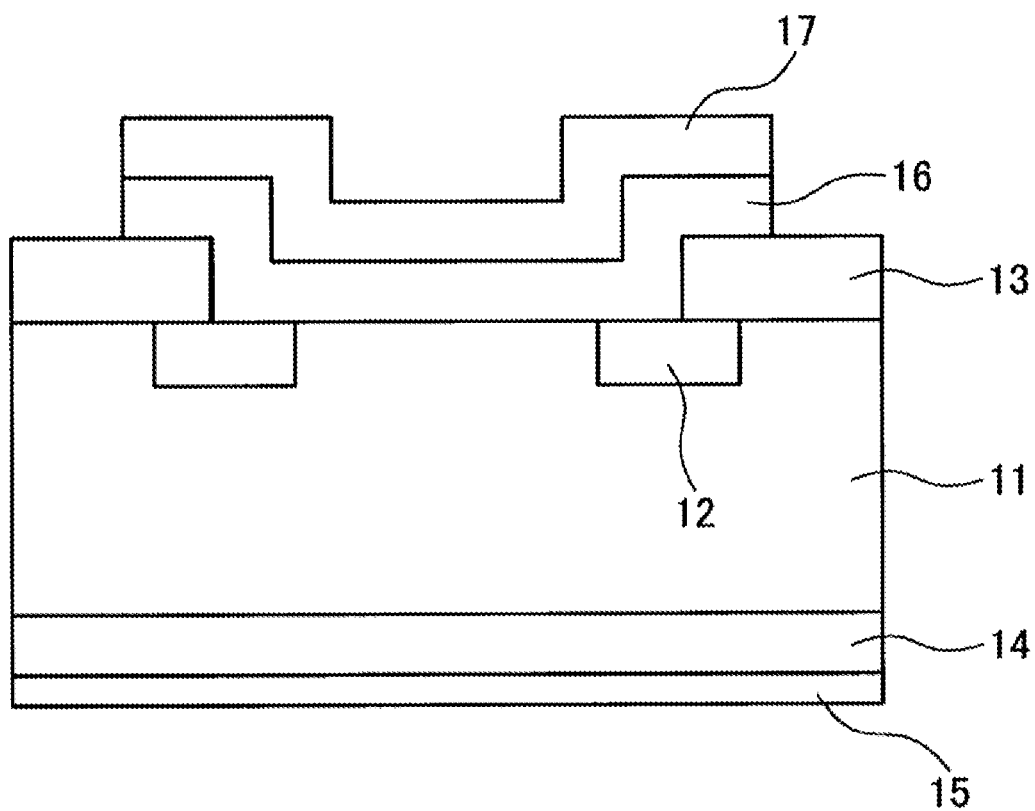
FIG. 7 is a cross-sectional view illustrating the method for manufacturing the Schottky barrier diode (part 6)

FIG. 7 is a cross-sectional view illustrating a process of forming the surface electrode. As illustrated in FIG. 7, the Schottky electrode 16 is covered with, for example, aluminum to form the surface electrode 17. The aluminum film is formed by a sputtering method under the conditions of, for example, a sputtering pressure of 0.2 Pa and a substrate temperature of 300° C. As the sputtering conditions, pressure may be in the range of 0.1 Pa to 1 Pa and the temperature of the SiC substrate 11 may be in the range of 100° C. to 500° C. In addition, aluminum including 0.1% to 10% of silicon may be used, instead of aluminum, and in this case, the same effect as described above is obtained.

Figure 8:
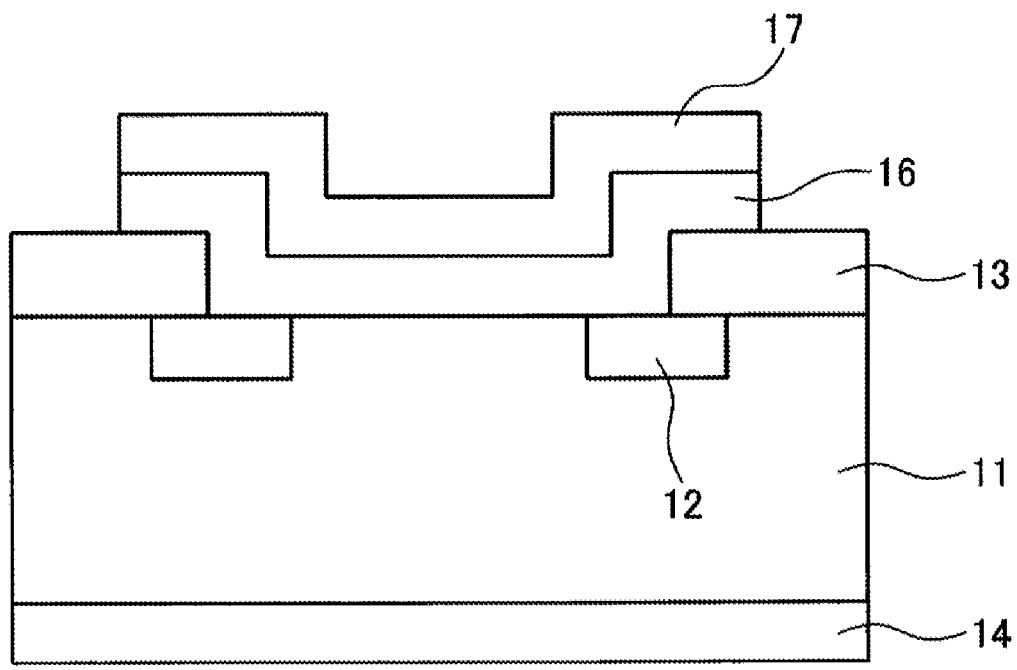
FIG. 8 is a cross-sectional view illustrating the method for manufacturing the Schottky barrier diode (part 7)
Figure 9:
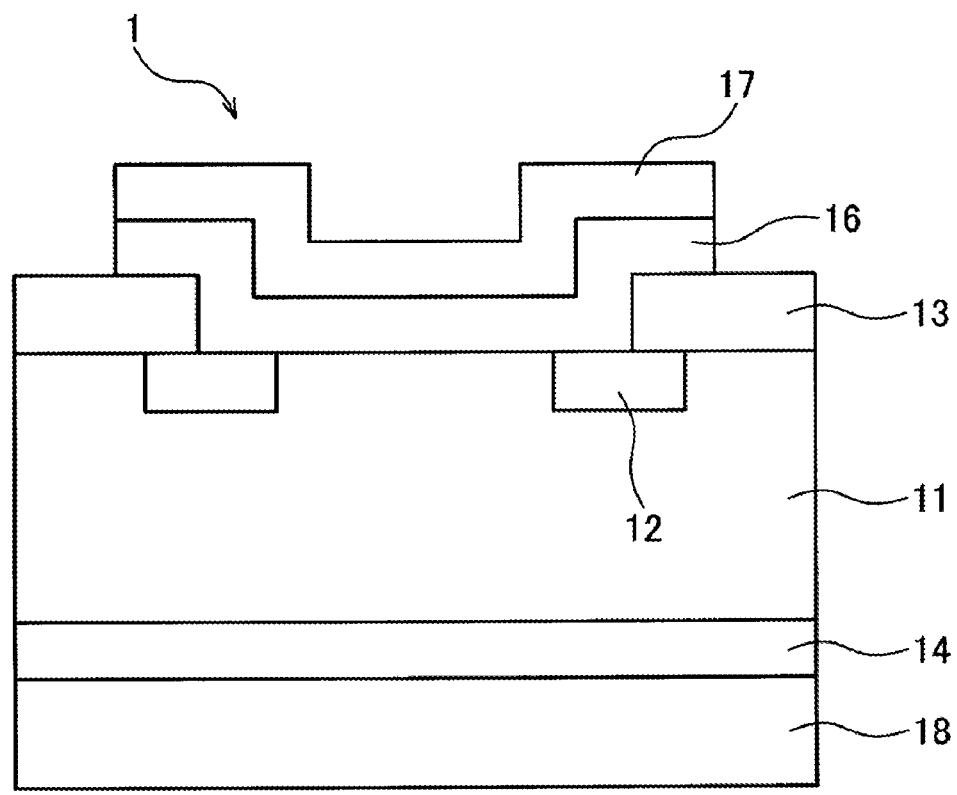
FIG. 9 is a cross-sectional view illustrating the method for manufacturing the Schottky barrier diode (part 8)

FIG. 8 is a cross-sectional view illustrating a process of removing the carbon layer. As illustrated in FIG. 8, the carbon layer 15 formed on the surface (the rear surface side of the SiC substrate 11) of the nickel silicide layer 14 including titanium carbide is removed. FIG. 9 is a cross-sectional view illustrating a process of forming a laminate of metal layers to form the rear surface electrode. The rear surface electrode 18, which is a laminate of titanium, nickel, and gold, is formed on the nickel silicide layer 14 including titanium carbide from which the carbon layer 15 is removed.

After the above-mentioned processes, the SiC substrate 11 which has been subjected to all film forming operations can be diced into SiC Schottky barrier diode chips. A surface electrode pad of the obtained semiconductor chip is bonded to a lead frame and a conductor on the substrate by an automatic wire bonding apparatus and molding is performed to obtain a discrete product.

EXAMPLE

Figure 10:
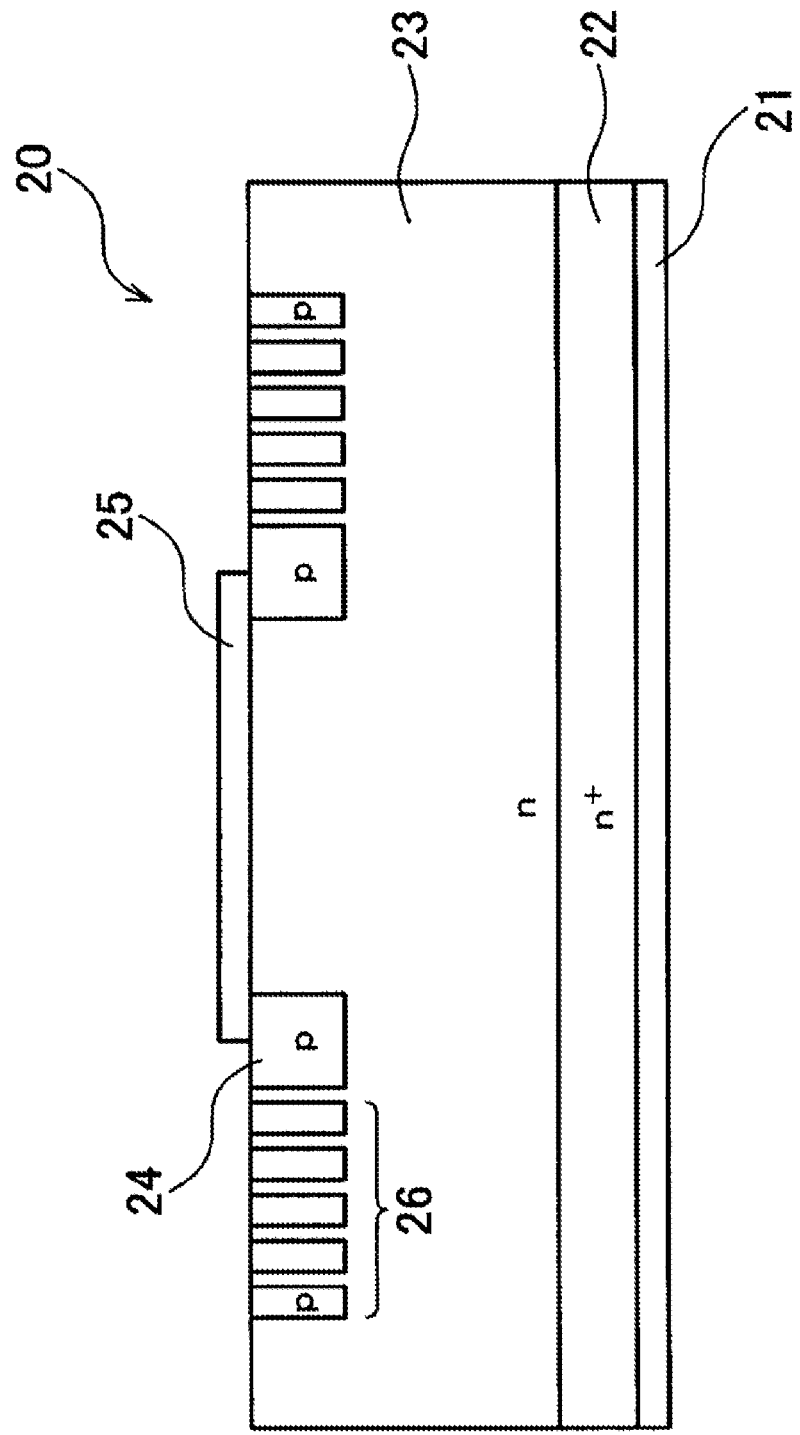
FIG. 10 is a cross-sectional view illustrating a Schottky barrier diode with a field limiting ring structure according to Example of the invention.

An example of a Schottky barrier diode manufactured by the manufacturing processes illustrated in FIGS. 1 to 9 will be described. FIG. 10 is a cross-sectional view illustrating a Schottky barrier diode (SBD) having a field limiting ring (FLR) structure according to an Example of the invention. A process of manufacturing an FLR-SBD 20 will be described.

First, an epitaxial layer (low-concentration n-type drift layer 23) is formed on a SiC substrate (high-concentration n-type substrate 22). An n-type region for a channel stopper, a p-type region (p-type impurity ion implantation region) 24 for a termination structure, a p-type region 26 with a floating limiting ring (FLR) structure 26 are formed on the SiC substrate 22 by ion implantation.

Then, an activation process was performed in an argon atmosphere at a temperature of 1620° C. for 180 seconds in order to activate phosphorus which was implanted in order to form the n-type region for a channel stopper and aluminum which was implanted in order to form the p-type region 24 for a termination structure and the p-type region 26 for an FLR structure. Then, a SiO film with a thickness of 500 nm was formed on the surface of the SiC substrate 22 by an atmospheric CVD apparatus.

A nickel layer with a thickness of 60 nm and a titanium layer with a thickness of 20 nm were formed on the rear surface of the SiC substrate 22 sequentially from the substrate by a sputtering apparatus. The formed SiC substrate 22 was heated by a rapid annealing apparatus (RTA) including an infrared lamp in an argon atmosphere at a temperature of 1050° C. for 2 minutes. Silicon atoms of the SiC substrate 22 were reacted with nickel by the heating process to generate a nickel silicide layer 21. As a result, it was possible to obtain an ohmic contact. The nickel silicide layer 21 illustrated in FIG. 10 becomes an ohmic electrode.

Carbon atoms of the SiC substrate 22 react with titanium to generate titanium carbide and are precipitated on the surface of the nickel silicide layer 21. In this case, unreacted carbon atoms remained in the nickel silicide layer 21, and the number of carbon atoms included in titanium carbide on the outermost surface of the nickel silicide layer 21 was equal to or greater than 12% of the total number of carbon atoms precipitated on the surface. Here, the number of carbon atoms was calculated by XPS analysis. The number of carbon atoms was calculated by the sum of a plurality of C1s peak intensities which were generated by chemical shift and a peak intensity ratio derived from TiC at a C1s peak which was observed in the vicinity of 283 eV.

Then, a contact hole was formed in an oxide film on the front surface by a hydrofluoric acid buffer solution (see FIG. 5 as a corresponding drawing). Then, a titanium film for a Schottky electrode 25 was formed with a thickness of 200 nm by the sputtering apparatus and was processed by a rapid annealing apparatus (RTA) including an infrared lamp in an argon atmosphere at a temperature of 500° C. for 5 minutes (see FIG. 6). In this case, carbon in the nickel silicide layer 21 was precipitated and a thin carbon layer was formed.

Then, an aluminum film for a surface electrode was immediately formed with a thickness of 5000 nm by the sputtering apparatus (see FIG. 7). Sputtering pressure is 0.2 Pa and the substrate temperature is 300° C. Here, aluminum including 0.1% to 10% of silicon may be used instead of aluminum.

After the layer of the surface electrode was formed, the SiC substrate 22 was attached to a vacuum pressure vessel including a substrate heating mechanism, with a rear surface thereof being exposed, and processing was performed on the SiC substrate 22 at 300° C. for 1 hour while introducing argon including 1% of oxygen or ozone to remove the carbon layer formed on the surface of the nickel silicide layer 21 (see FIG. 8). Alternately, reverse sputtering may be used, and in this case, it is possible to obtain the same effect as described above. Then, a titanium film with a thickness of 70 nm, a nickel film with a thickness of 700 nm, and a gold film with a thickness of 200 nm were continuously formed on the nickel silicide layer 21 by vapor deposition using a vapor deposition apparatus to form a rear surface electrode which was a metal laminate (see FIG. 8). The rear surface electrode including the nickel silicide layer (ohmic electrode) 21 and the metal layers formed on the ohmic electrode 21 forms a rear surface electrode structure of the FLR-SBD 20.

Then, the SiC substrate 22 having the rear surface electrode structure formed thereon was diced. As a result, it was possible to obtain a SiC-SBD in which, for example, during the dicing process, the rear surface electrode did not peel off at all and an on-voltage (Vf) at room temperature was 1.7 V.

Figure 11:
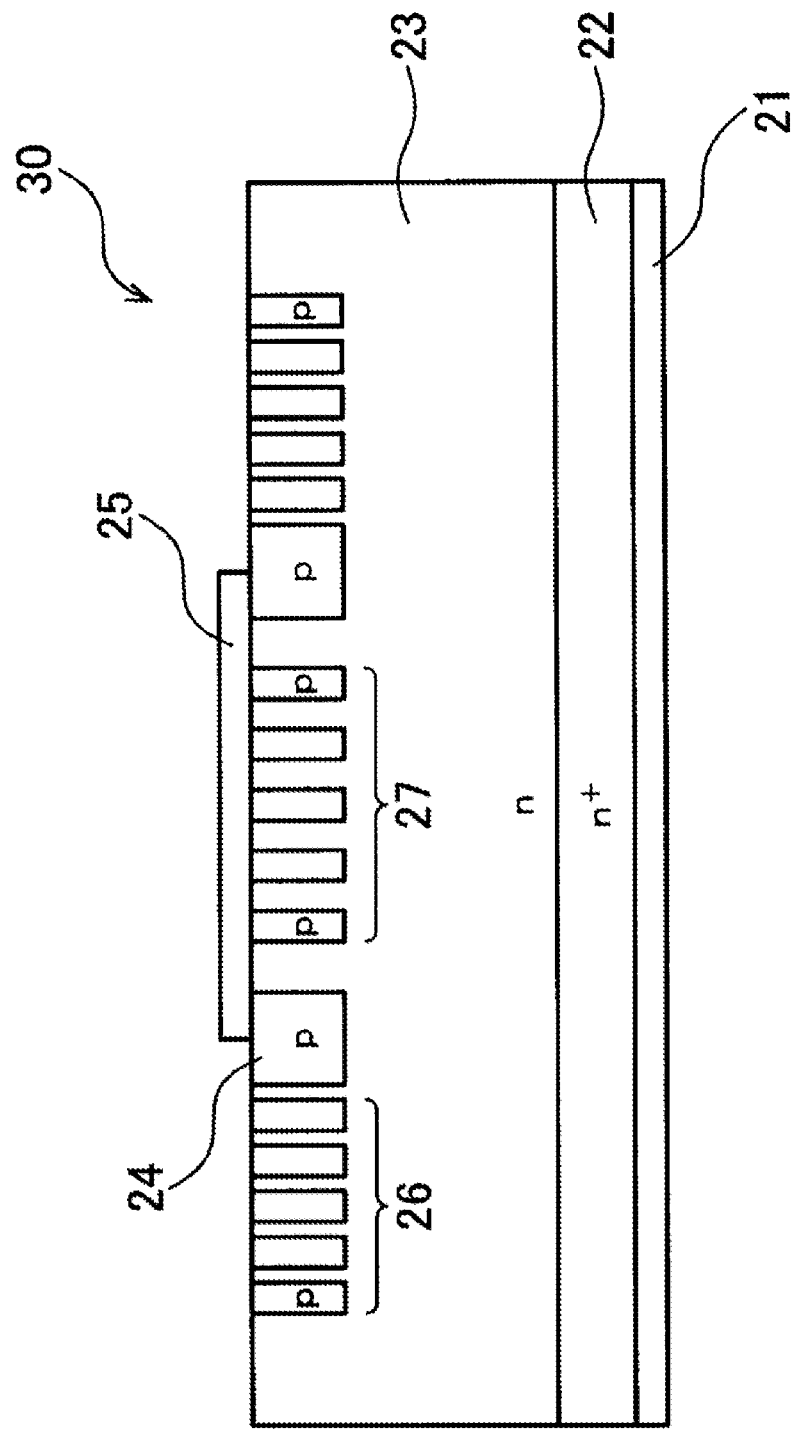
FIG. 11 is a cross-sectional view illustrating a Schottky barrier diode with a junction barrier Schottky structure according to Example of the invention.

The invention is not limited to the SBD with the FLR structure 26 illustrated in FIG. 10. In an SBD with a junction barrier Schottky (JBS) structure, the same result that the rear surface electrode did not peel off was obtained. FIG. 11 is a cross-sectional view illustrating a Schottky barrier diode (SBD) with a junction barrier Schottky (JBS) structure 27 according to another Example of the invention. In a JBS-SBD 30, a p-type Schottky electrode 27 is formed between p-type regions (p-type impurity ion implantation regions) 24 for a termination structure on the SiC substrate 22.

The relationship between the temperature of the SiC substrate 22 and the reflectance of a surface electrode pad when a surface electrode is formed of aluminum at a sputtering pressure of 0.2 Pa in the JBS-SBD 30 will be described. In this case, the cross-section of a manufactured chip was observed by a cross-sectional transmission electron microscope (TEM). The result proved that an uneven pattern was closely covered at a substrate temperature of 100° C. or higher.

Figure 12:
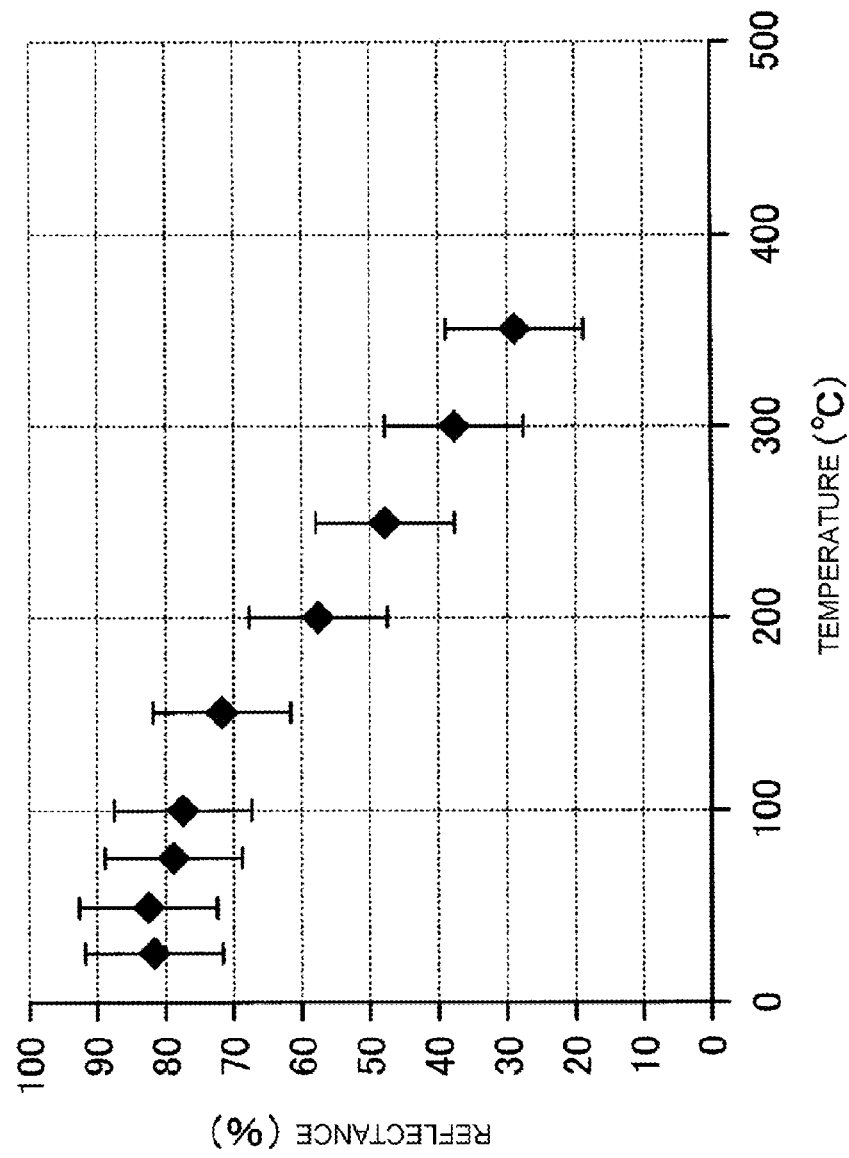
FIG. 12 is a diagram illustrating the relationship between temperature and reflectance when a surface electrode according to the invention is formed.

FIG. 12 is a diagram illustrating the relationship between the temperature and reflectance when the surface electrode according to the invention is formed. When the temperature of the SiC substrate 11 is equal to or higher than 100° C. and equal to or lower than 500° C. during the formation of the surface electrode 17, the surface electrode 17 can have predetermined reflectance. The reflectance can be reduced as the temperature increases.

Figure 14:
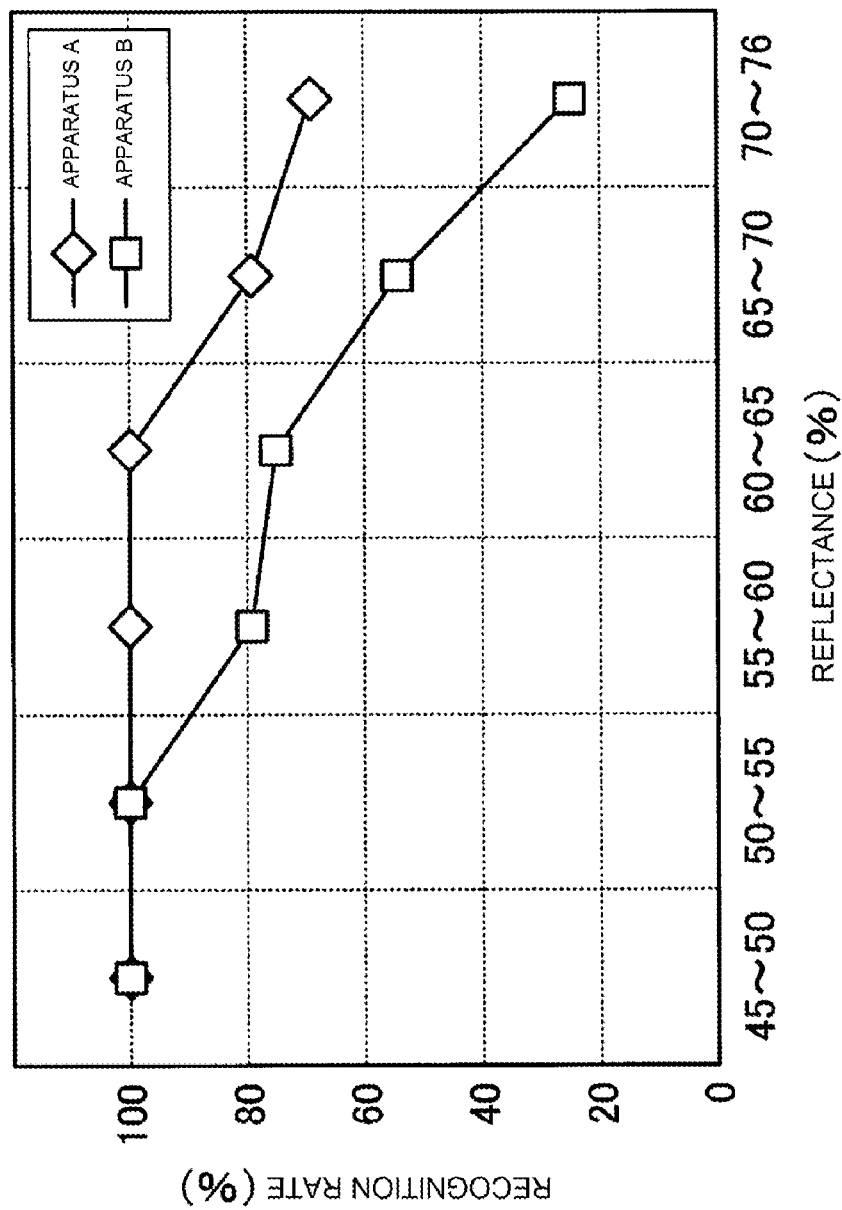
FIG. 14 is a diagram illustrating the relationship between the reflectance of the surface electrode in the SiC semiconductor device according to the invention and the recognition rate of the automatic wire bonding apparatus (part 2).

FIGS. 13 and 14 are diagrams illustrating the relationship between the reflectance of the surface electrode in the SiC semiconductor device according to the invention and the recognition rate of an automatic wire bonding apparatus. FIG. 13 shows the number of samples N for a plurality of levels of reflectance and the number of samples recognized and the recognition rate of each of different automatic wire bonding apparatuses A and B. In FIG. 14, the horizontal axis indicates reflectance (%) and the vertical axis indicates the recognition rates (%) of the automatic wire bonding apparatuses A and B.

As illustrated in FIGS. 13 and 14, when the automatic wire bonding apparatus A was used, the recognition rate was 100% at a reflectance of 65% or less. When the automatic wire bonding apparatus B was used, the recognition rate was 100% at a reflectance of 55% or less. Therefore, both the automatic wire bonding apparatuses A and B could have a recognition rate of 100% at a reflectance of 55% or less. In the example illustrated in FIG. 12, when the temperature is 250° or higher during the formation of the surface electrode, the reflectance can be equal to or less than 50% and the recognition rate can be 100%.

Comparative Example

As a comparison target to be compared with the above-mentioned example, a SiC semiconductor device was manufactured by the same manufacturing process as described above. In the Comparative Example, the manufacturing process was different from that in Example in that aluminum was formed at a room temperature in the formation of a surface electrode. In the obtained SiC semiconductor device, which was a comparison target, the cross-section of a surface electrode 17 was observed by a TEM. As a result, a void (void) in the surface electrode 17 was observed. That is, the SiC semiconductor device was manufactured in which a portion of the uneven pattern of a Schottky electrode 16 was not closely covered with the surface electrode 17 and a surface electrode structure including the Schottky electrode 16 and the surface electrode 17 did not have a good quality. In addition, the reflectance of the surface electrode 17 was 82% and the surface electrode 17 was not recognized by the automatic wire bonding apparatus.

As can be seen from a comparison of the results between the Example and the Comparative Example, the surface electrode of the SiC semiconductor device according to the invention closely covers the uneven pattern and has reflectance the most suitable for recognizing an image when automatic wire bonding is performed. Therefore, it is possible to manufacture a SiC semiconductor device with high reliability. In addition, it is possible to optimize the reflectance of the surface electrode. Therefore, it is possible to improve yield when the manufactured SiC semiconductor device is mounted using the automatic wire bonding apparatus and to improve productivity.

The above-described embodiment and Example are provided for ease of understanding of the invention and the invention is not limited thereto. For example, a Schottky barrier diode has been described above. However, the SiC semiconductor device according to the invention is not limited to a Schottky barrier diode, but the invention can be applied to various types of semiconductor devices using SiC, such as MOSFETs.

The SiC semiconductor device of the invention can be used as a Schottky barrier diode with a high voltage and a breakdown voltage of, for example, 1000 V or more. According to the SiC semiconductor device of the invention, it is possible to reduce on-resistance while suppressing leakage. Therefore, it is possible to reduce the area of a chip and to reduce manufacturing costs. In addition, it is possible to manufacture a diode with a high rated voltage and the invention can be applied to inverters of, for example, industrial electric motors or Shinkansen trains requiring a large amount of current. Accordingly, it is possible to improve the efficiency of a diode and to reduce the size of the diode.

As described above, the method for manufacturing a semiconductor device according to the invention is useful for power semiconductor devices, such as power devices, or power semiconductor devices which are used to control industrial or automotive motors or to control engines.

It is understood that various other modifications will be apparent to and can be readily made by those skilled in the art without departing from the scope and spirit of the present invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:

1. A method for manufacturing a semiconductor device having an improved recognition rate by an automatic wire bonding apparatus, comprising:
   (a) providing a silicon carbide semiconductor substrate; and
   (b) forming an electrode structure on the silicon carbide semiconductor substrate by:
      (i) forming a Schottky layer including a metal selected from the group consisting of titanium, tungsten, molybdenum, and chrome on a front surface of the silicon carbide semiconductor substrate;
      (ii) heating the Schottky layer to form a Schottky electrode which has a Schottky contact with the silicon carbide semiconductor substrate; and
      (iii) forming a surface electrode comprised of aluminum or aluminum including silicon on a surface of the Schottky electrode, while heating at a temperature range effective for the surface electrode to closely cover any uneven portion of the Schottky electrode and provide a surface electrode having a predetermined reflectance that is equal to or less than 80% so that said improved recognition rate is obtained.

2. The method for manufacturing a semiconductor device according to claim 1, wherein the surface electrode is formed by a sputtering method during which sputtering pressure ranges from 0.1 Pa to 1 Pa, and the silicon carbide semiconductor substrate is at a temperature ranging from 100° C. to 500° C.

3. The method for manufacturing a semiconductor device according to claims 2, wherein a rear surface electrode structure is formed on a rear surface of the silicon carbide semiconductor substrate, the rear surface electrode structure including an ohmic electrode comprised of a nickel silicide layer including titanium carbide, and a rear surface electrode, comprised of a metal layer.

4. The method for manufacturing a semiconductor device according to claim 2, wherein forming the surface electrode while heating is performed at a temperature ranging from 200° to 500° C. so that the surface electrode has a reflectance ranging from 45% to 65% and said recognition rate of the semiconductor device approximates 100%.

5. The method for manufacturing a semiconductor device according to claim 1, wherein forming the surface electrode while heating provides the surface electrode with a reflectance ranging from 45% to 65%.

6. The method for manufacturing a semiconductor device according to claim 5, wherein a rear surface electrode structure is formed on a rear surface of the silicon carbide semiconductor substrate, the rear surface electrode structure including an ohmic electrode comprised of a nickel silicide layer including titanium carbide, and a rear surface electrode, comprised of a metal layer.

7. The method for manufacturing a semiconductor device according to claim 5, wherein forming the surface electrode while heating is performed at a temperature ranging from 200° to 500° C. so that the surface electrode has a reflectance ranging from 45% to 65% and said recognition rate of the semiconductor device approximates 100%.

8. The method for manufacturing a semiconductor device according to claim 1, wherein a rear surface electrode structure is formed on a rear surface of the silicon carbide semiconductor substrate, the rear surface electrode structure including an ohmic electrode comprised of a nickel silicide layer including titanium carbide, and a rear surface electrode, comprised of a metal layer.

9. A method for manufacturing a semiconductor device having an improved recognition rate by an automatic wire bonding apparatus, comprising:
(a) providing a silicon carbide semiconductor substrate; and
(b) forming an electrode structure on the silicon carbide semiconductor substrate by:
(i) forming a Schottky layer including a metal selected from the group consisting of titanium, tungsten, molybdenum, and chrome on a front surface of the silicon carbide semiconductor substrate; and
(ii) heating the Schottky layer to form a Schottky electrode which has a Schottky contact with the silicon carbide semiconductor substrate; and
(iii) forming a surface electrode comprised of aluminum or aluminum including silicon on a surface of the Schottky electrode, while heating at a temperature range effective for the surface electrode to closely cover any uneven portion of the Schottky electrode and provide a surface electrode having a predetermined reflectance so that said improved recognition rate is obtained; and (iv) forming a rear surface electrode structure on a rear surface of the silicon carbide semiconductor substrate, the rear surface electrode structure including an ohmic electrode comprised of a nickel silicide layer including titanium carbide, and a rear surface electrode, comprised of a metal layer.

10. The method for manufacturing a semiconductor device according to claim 9, wherein the surface electrode is formed by a sputtering method during which sputtering pressure ranges from 0.1 Pa to 1 Pa, and the silicon carbide semiconductor substrate is at a temperature ranging from 100° C. to 500° C.

11. The method for manufacturing a semiconductor device according to claim 9, wherein forming the surface electrode while heating is performed in a temperature range in which the surface electrode has a reflectance that is equal to or less than 80%.

12. The method for manufacturing a semiconductor device according to claim 9, wherein forming the surface electrode while heating is performed at a temperature ranging from 200° to 500° C. so that the surface electrode has a reflectance ranging from 45% to 65% and said recognition rate of the semiconductor device approximates 100%.

13. A method for manufacturing a semiconductor device having an improved recognition rate by an automatic wire bonding apparatus, comprising:
(a) providing a silicon carbide semiconductor substrate; and
(b) forming an electrode structure on the silicon carbide semiconductor substrate by:
(i) forming a Schottky layer including a metal selected from the group consisting of titanium, tungsten, molybdenum, and chrome on a front surface of the silicon carbide semiconductor substrate;
(ii) heating the Schottky layer to form a Schottky electrode which has a Schottky contact with the silicon carbide semiconductor substrate; and
(iii) forming a surface electrode comprised of aluminum or aluminum including silicon on a surface of the Schottky electrode, while heating at a temperature range effective for the surface electrode to closely cover any uneven portion of the Schottky electrode and provide a surface electrode having a predetermined reflectance that is equal to or less than 80% so that said improved recognition rate is obtained,
wherein the surface electrode is formed by a sputtering method during which sputtering pressure ranges from 0.1 Pa to 1 Pa, and the silicon carbide semiconductor substrate is at a temperature ranging from 200° to 500° C. so that the surface electrode has a reflectance ranging from 45% to 65% and said recognition rate of the semiconductor device approximates 100%.

14. The method for manufacturing a semiconductor device according to claim 13, further comprising forming a rear surface electrode structure on a rear surface of the silicon carbide semiconductor substrate, the rear surface electrode structure including an ohmic electrode comprised of a nickel silicide layer including titanium carbide, and a rear surface electrode, comprised of a metal layer.

* * * * *